United States Patent
Deeney

(12) 
(10) Patent No.: US 6,600,661 B1
(45) Date of Patent: Jul. 29, 2003

(54) METHOD AND APPARATUS FOR SUPPORTING A CIRCUIT COMPONENT

(75) Inventor: Jeffrey L. Deeney, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/118,418

(22) Filed: Apr. 8, 2002

(51) Int. Cl.$^7$ .................................................. H05K 7/14
(52) U.S. Cl. ..................... 361/801; 361/704; 361/715; 361/707; 361/825; 361/764; 257/726; 257/718; 257/719
(58) Field of Search .................................. 361/801, 764, 361/807, 825, 726, 740, 682, 732, 759, 754, 704, 707, 709, 710, 715; 257/726, 727, 718, 719

(56) References Cited

U.S. PATENT DOCUMENTS

| | | |
|---|---|---|
| 4,545,610 A | 10/1985 | Lakritz et al. |
| 5,222,014 A | 6/1993 | Lin |
| 5,244,143 A | 9/1993 | Ference |
| 5,541,450 A | 7/1996 | Jones et al. |
| 5,557,503 A | 9/1996 | Isaacs |
| 5,615,735 A | 4/1997 | Yoshida |
| 5,805,427 A | 9/1998 | Hoffman |
| 5,926,370 A | 7/1999 | Cromwell |
| 6,061,235 A | 5/2000 | Cromwell |
| 6,084,178 A | 7/2000 | Cromwell |
| 6,198,630 B1 | 3/2001 | Cromwell |
| 6,208,515 B1 * | 3/2001 | Klein .......................... 361/704 |
| 6,231,333 B1 | 5/2001 | Gruber |
| 6,235,996 B1 | 5/2001 | Farooq |
| 6,276,596 B1 | 8/2001 | Gruber |
| 6,487,079 B2 * | 11/2002 | Katsui ......................... 361/704 |

OTHER PUBLICATIONS

Jeffrey L. Deeney, patent application filed on Nov. 16, 2001 titled Method And Apparatus For Supporting Circuit Component Having Solder Column Array Interconnects Using Interposed Support Shims, Attorney Docket No. 10015588–1, pp. 1–13 and 1 sheet of a drawing.

Jeffrey L. Deeney et al., patent application filed on Nov. 16, 2001 titled Method And Apparatus For Supporting A Circuit Component Having A Solder Column Interconnects Using An External Support, Attorney Docket No. 11015590–1, pp. 1–15 and 2 sheets of drawings.

Thomas J. Augustin et al., patent application filed on Nov. 16, 2001 titled Method And Apparatus For Shock And Vibration Isolation Of A Circuit Component, Attorney Docket No. 10014433–1, pp. 1–15 and 2 sheets of drawings.

Thomas P. Dolbear et al., Effect of Mechanical Shock and Vibration on the Second–level Temperature Cycling Reliability of Ceramic Ball Grid Arrays with a Continuous Compressive Load Applied, 5 unnumbered pages.

(List continued on next page.)

*Primary Examiner*—David Martin
*Assistant Examiner*—Hung Bui

(57) ABSTRACT

A support assembly useful for supporting an integrated circuit package having an array of solder columns extending to a circuit board when the integrated circuit package is mounted on the circuit board. The support assembly includes a support member for supporting the integrated circuit package and having a ramped surface. A biasing member associated with the support member couples the ramped surface to the integrated circuit package such that the support member resists downward movement of the integrated circuit package. The support member may include a plurality of support members with ramped surfaces which cooperate to raise a combined height of the support members. A related method of supporting an integrated circuit package is also provided.

20 Claims, 4 Drawing Sheets

OTHER PUBLICATIONS

R. Bargerhuff et al., Development of a Large Heatsink Support Structure, 12 unnumbered pages.

Jeffrey L. Deeney et al., patent application filed on Nov. 6, 2001 titled Method And Apparatus of Supporting Circuit Component Having A Solder Column Array Using Interspersed Rigid Columns, Attorney Docket No. 10015587–1, pp. 1–9 and 1 sheet of drawings.

* cited by examiner

METHOD AND APPARATUS FOR SUPPORTING A CIRCUIT COMPONENT

FIELD OF THE INVENTION

This invention relates to circuit components mounted on circuit boards by solder column interconnects or arrays, and more particularly, the support of circuit components having column grid arrays.

BACKGROUND OF THE INVENTION

Solder column interconnects or arrays are used to interconnect circuit packages to circuit boards, most typically large ceramic integrated circuit packages. One such package is the column grid array (CGA) integrated circuit package that has a ceramic substrate with an array of solder columns that extend out from it, typically from the bottom surface. The solder columns are attached at one end to connection pads or locations on the ceramic substrate. The solder columns are sufficiently tall so that when the circuit package is placed on a circuit board, the solder columns can accommodate the difference in thermal expansion between the ceramic integrated circuit package and the printed circuit board. The solder columns are soldered to respective pads on the circuit board using known techniques, such as a convection reflow solder process.

One problem with solder column arrays is that the solder columns do not withstand compressive force well. The solder columns in the solder column arrays are typically made of a 90%/10% Pb/Sn solder, making them soft. Moreover, the individual solder columns are very thin. Consequently, if any significant amount of compressive force is applied to the circuit package, such as might be applied by a cooling solution such as a heat sink or fan, the resulting weight on the circuit package may cause the solder column array to compress, particularly over time, which may compromise reliability. In this regard, loads in excess of about 10 to 20 grams per column exert sufficient compressive force so that reliability may be compromised. Since CGA integrated circuit packages are being increasingly used for high power integrated circuits, the cooling solution required often has considerable mass. It is not unusual for the heat sink or cooling solution used with such high power integrated circuits to exceed one pound. When such large cooling solutions are exposed to shock and vibration that is encountered at the system level, it is not uncommon to have thirty to forty pounds of force applied to the top of the integrated package. Such high loading can cause the solder columns to bend and deform.

SUMMARY OF THE INVENTION

In one aspect of the present invention, a support assembly useful for supporting an integrated circuit package having an array of solder columns extending to a circuit board when the integrated circuit package is mounted on the circuit board is provided. The support assembly includes a support means for supporting the integrated circuit package and the support means has a ramped surface. Also included is a biasing means associated with the support means for coupling the ramped surface to the integrated circuit package such that the support means resists downward movement of the integrated circuit package.

In another aspect of the present invention, a support assembly useful for supporting an integrated circuit package having an array of solder columns extending to a circuit board when the integrated circuit package is mounted on the circuit board is provided. The support assembly includes a support member supporting the integrated circuit package and the support member has a ramped surface. Also included is a cooperating support member having a cooperating ramped surface cooperating with the ramped surface of the support member. Additionally included is a biasing member associated with the first and second support members to bias the first and second ramped surfaces together to adjust a height of the combined first and second support members to contact the integrated circuit package.

In yet another aspect of the present invention a method useful for supporting an integrated circuit package mounted on the circuit board by an array of solder columns extending between the integrated circuit package and the circuit board is provided. The method includes locating a support member having a ramped surface in a position to support the integrated circuit package. The method also includes biasing the support member to retain the support member in supporting relationship with the integrated circuit package and enabling the support member to resist a downward force on the integrated circuit package.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings wherein.

DETAILED DESCRIPTION

The following detailed description is merely exemplary in nature and is in no way intended to limit the invention, its application, or uses. For example, it should be understood that while the invention is described as implemented in CGA integrated circuit package, it is not limited to CGA integrated circuit packages and can be utilized on any circuit package having a solder column array. Additionally, e.g., CGA integrated circuit package can be a CPU package but can also be other types of circuit packages, such as ASICs (application specific integrated circuits).

Figure 1:
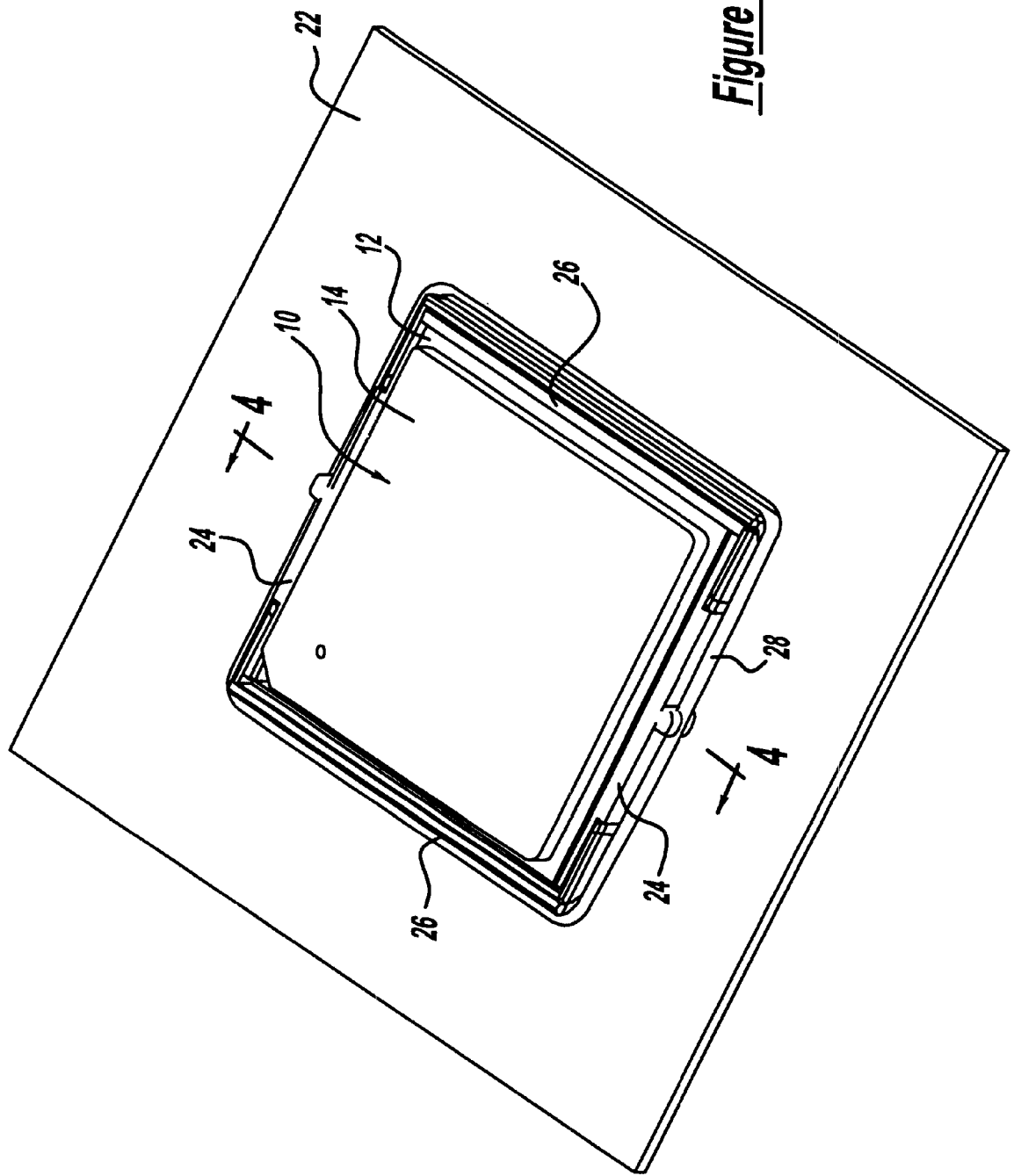
FIG. 1 is a perspective view of a column grid array integrated circuit package mounted on a circuit board and having a preferred support assembly.
Figure 4:
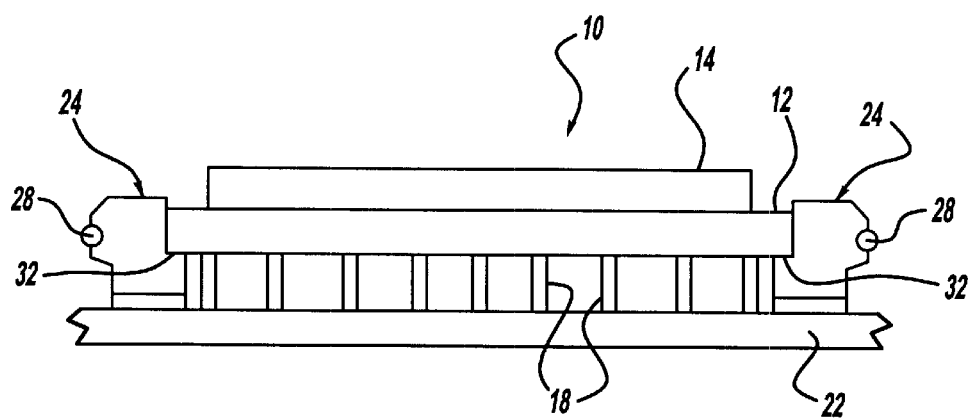
FIG. 4 is a cross-sectional view taken along line 4—4 of FIG. 1.

Referring to FIG. 1, CGA integrated circuit package 10 has a substrate 12, usually made of ceramic, and a package lid 14. As seen in FIG. 4, a solder column array having an array of solder columns 18 extends from a bottom side of substrate 12. When CGA integrated circuit package 10 is mounted on circuit board 22, solder columns 18 of solder column array are soldered to respective connection pads on circuit board 22, which is illustratively a printed circuit board.

Returning to FIG. 1, a support assembly is attached to CGA integrated circuit package 10. The illustrated preferred support assembly generally includes a pair of first opposing members 24, a pair of second opposing members 26 and a biasing mechanism 28, such as a spring or elastic material. The support members 24, 26 are made of material that is sufficiently rigid to support CGA integrated circuit package 10 against compressive force, such as is imposed by a cooling solution mounted to CGA integrated circuit package 10. In addition, the material forming the support members 24, 26 preferably has a similar coefficient of thermal expansion as the solder columns 18. For example, the support members 24, 26 can be made of metal or plastic. In the case of 90/10 lead/tin solder columns 18, the support members 24, 26 are preferably constructed of die cast zinc.

Figure 2:
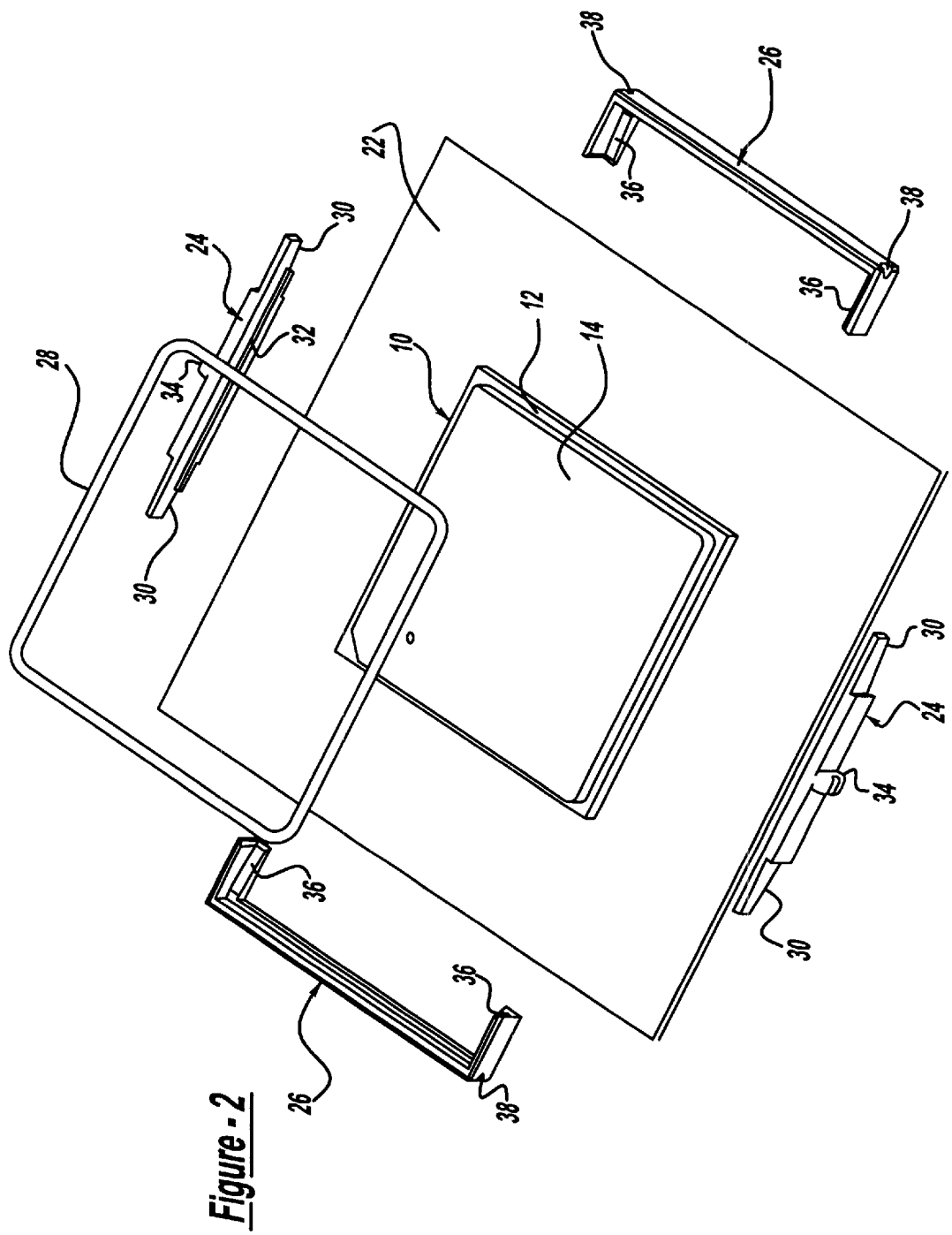
FIG. 2 is an expanded perspective view of the support assembly of FIG. 1.
Figure 3:
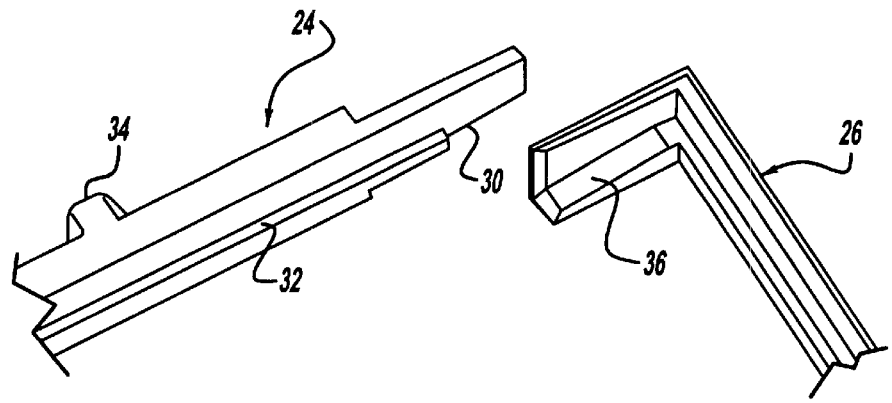
FIG. 3 is a fragmentary expanded perspective view illustrating the ramps of the support assembly of FIG. 1.

Referring to FIG. 2, the support assembly is described in more detail. First opposing members 24 are located on opposite sides of the integrated circuit package 10. Each of these side members includes a ramped surface 30 at each end thereof. The side members also include a protruding ledge portion 32 which, when assembled around the integrated circuit package 10, operates against the bottom of the substrate 12 as seen in FIG. 4. Each side member 24 also includes a biasing member guide 34. The biasing member guide 34 locates the biasing member 28 and maintains in place. As illustrated, the guide 34 extends laterally to enable the biasing member 28 to provide a force to retain the side members 24 in position against the integrated circuit package 10 when the biasing member 28 is in place. The biasing member 28 maintains the support assembly in proper location against the integrated circuit package 10, which in turn maintains the substrate 12 at a predetermined distance above the surface of the circuit board 22, as discussed hereinafter.

The support assembly also includes a pair of second opposing members 26 located on opposite sides of the integrated circuit package 10. Each of these end members 26 includes a ramped surface 36 at each end thereof. The ramped surfaces 36 are arranged so that they cooperate with corresponding ramped surfaces 30 of the first opposing members 24. Each end member 26 also includes a biasing member guide 38 at each corner. Thus, when the support assembly is assembled around the integrated circuit package 10, the biasing member 28 is in place and held by the guide members 34, 38.

The biasing member 28 causes the ramps 30, 36 to be pulled against each other which raises the height of the protruding ledge 32 to rest against the bottom surface of the substrate 12. Consequently, the biasing member 28 preferably brings the side members 24 into coupled (e.g., contacting) position with the substrate 12 and maintains the side members 24 in position. Any movement of the substrate 12 down toward the circuit board 22 is resisted by support provided by the stagnant support members 24, 26. The force of the biasing member 28 against the support members 24, 26 is preferably, less than about 2 pounds; more preferably, less than about 1.5 pounds; and even more preferably, less than about 1 pound. Thus, the support is preferably not provided by using a strong biasing member 28 that provides a significant initial upward biasing force on the substrate 12.

A strong biasing force might damage the solder columns 18, particularly one intended to match shock and vibration loadings. Consequently, the biasing member 28 in cooperation with the ramped surfaces 30, 36 and support members 24, 26 preferably exerts an upward force on the substrate that is less than about 12 pounds; and more preferably, less than about 10 pounds; and even more preferably, less than about 8 pounds. The biasing member 28 is preferably a band material as illustrated. Such a biasing member 28 may be easily added and removed as necessary. More preferably, the biasing member 28 is selected from a coiled spring, and an elastic band; even more preferably, from a steel coiled spring, and a rubber O-ring; and even more preferably, a stainless steel spring.

Since the biasing member 28 is preferably not the primary mechanism by which the substrate 12 is maintained in position about the circuit board 22, the cooperating ramped surfaces 30, 36 of the support members 24, 26 is preferably the primary mechanism to maintain the substrate 12 in place at a distance above the circuit board 22. In order to provide this function, the angle of the ramped surfaces 30, 36 is preferably such that a downward force on the substrate 12 passes through the cooperating ramped surfaces 30, 36 without causing the ramped surfaces 30, 36 to slide against each other.

Thus, the angle of the ramped surfaces 30, 36 is preferably small enough that the tangent of the angle (from horizontal) is less than the coefficient of friction between the cooperating ramped surfaces 30, 36. In addition, the angle of the ramped surfaces 30, 36 is preferably great enough that they allow for a height adjustment of the protruding ledge 32 of at least about 1.0 millimeter, more preferably, of at least about 0.5 millimeter; and even more preferably, of about 0.25 millimeter. It has been found that the angle of the ramped surfaces 30, 36 is preferably from about 5 degrees to about 15 degrees; and more preferably, about 10 degrees.

From the above description, it can be seen that the biasing member 28 operates a biasing means associated with the support means 24, 26 for pulling the ramped surfaces 30, 32 together. Pulling the ramped surfaces 30, 32 together also operates to increase a height of the combined first and second support members 24, 26. Of course, many biasing means 28 other than that discussed above may be utilized. For example, the biasing means 28 may alternatively be affixed to the support members 24, 26 such that it does not extend entirely around the entire periphery of the support members 24, 26. Similarly, although the illustrated biasing means 28 is placed in tension to provide the desired biasing force, a biasing means may be placed in compression to provide the force against the support members 24, 26 (e.g., by pressing against another component fixed to the circuit board 22).

It is also apparent that the support members 24, 26 operate as a support means for supporting the integrated circuit package 10. Thus, the support means 24, 26 includes a ramped surface 30, 32 as previously described which allows for an adjustment of the height of the support means 24, 26. This is advantageous for several reasons. For example, due to manufacturing tolerances, the height of CGA integrated circuit package 10 can vary by +/−5 mils. The support assembly of the present invention may automatically adjust for the variations inherent in the manufacturing process, rather than relying on creep in the solder columns 18 to allow the CGA integrated circuit package 10 to settle downward. Since the downward creep required can be up to 10 mils for an 87 mil tall column, resistance of the solder columns to fatigue failures can be compromised if the support means 24, 26 is not automatically adjustable.

Similarly, the adjustable nature of the support assembly may enable accommodation of changes resulting from thermal expansion and contraction. For example, the height of the integrated circuit package 10 may change, due to thermal expansion or contraction of the solder columns 18. Similarly, expansion or contraction of the material of the external support members 24, 26 per se may also be accommodated.

Many modifications may be made to the illustrated support means 24, 26. For example, the middle sections of the end support members 26 between the corners may be thinned or eliminated completely. Thus, instead of having the entire lower surface of the end support members 26 contacting the circuit board 28, legs may be used. Additionally, the lower surface of the end support members 26 or the legs may alternatively contact some other component attached to the circuit board 22, rather than contacting the circuit board 22 directly.

Many modifications may also be made to the way the side members 24 of the support means are associated with the integrated circuit package 10 to provide the supporting structure. As indicated above, the protruding ledge 32 pushes against the bottom surface of the substrate 12 of the integrated circuit package 10. Of course, such a ledge 32 may push against some other portion of the integrated circuit package 10, such as an extension of the package lid 14. Alternatively, the integrated circuit package 10 may have a protrusion(s) which fit into a recess(es) in the support members 24, 26.

As another alternative, the opposing side support members 24 may be affixed to the integrated circuit package 10 by adhesive rather than using a ledge 32. The adhesive can be any adhesive suitable for bonding the material of which support members 24 are made to CGA integrated circuit package 10. For example, if the support members 24 are made of stainless steel, then an epoxy adhesive could be used, such as 3M DP460 available from Minnesota Mining and Manufacturing, St. Paul, Minn. Illustratively, adhesives such as Loctite 3526 available from Loctite Corporation, Rocky Hills, Conn., or a single part thermoset epoxy such as Ablestik Laboratories 84.3, available from Ablestik Laboratories, Rancho Dominguez, Calif. could also be used.

The inclusion of a vibration isolation material may also alternatively be provided, e.g., between the support members 24, 26 and the integrated circuit package 10. For example, vibration isolation material may be provided on the side support members 24 covering the protruding ledge portion 32 and the inner wall. This isolation material dampens any vibration or shock which may be occurring to the printed circuit board 22 to minimize or eliminate its transfer to the CGA integrated circuit package 10. This isolation material may be any material and or structure known for its vibration and/or shock dampening properties.

Exemplary preferred isolation materials include polystyrene, visco-elastic polymer, and thermo set polyether-based polyurethane. Certain of these materials are sold under the trade names Styrofoam and Sorbathane. In addition, various isolation materials having a honeycombed or other closed cell or open cell internal structure may be utilized. In fact, the isolation material may be made of a material where the material per se is not known for its shock or vibration dampening properties, but which is constructed in such a way that it offers these properties (e.g., a foamed plastic layer including a plurality of air pockets).

Figure 5:
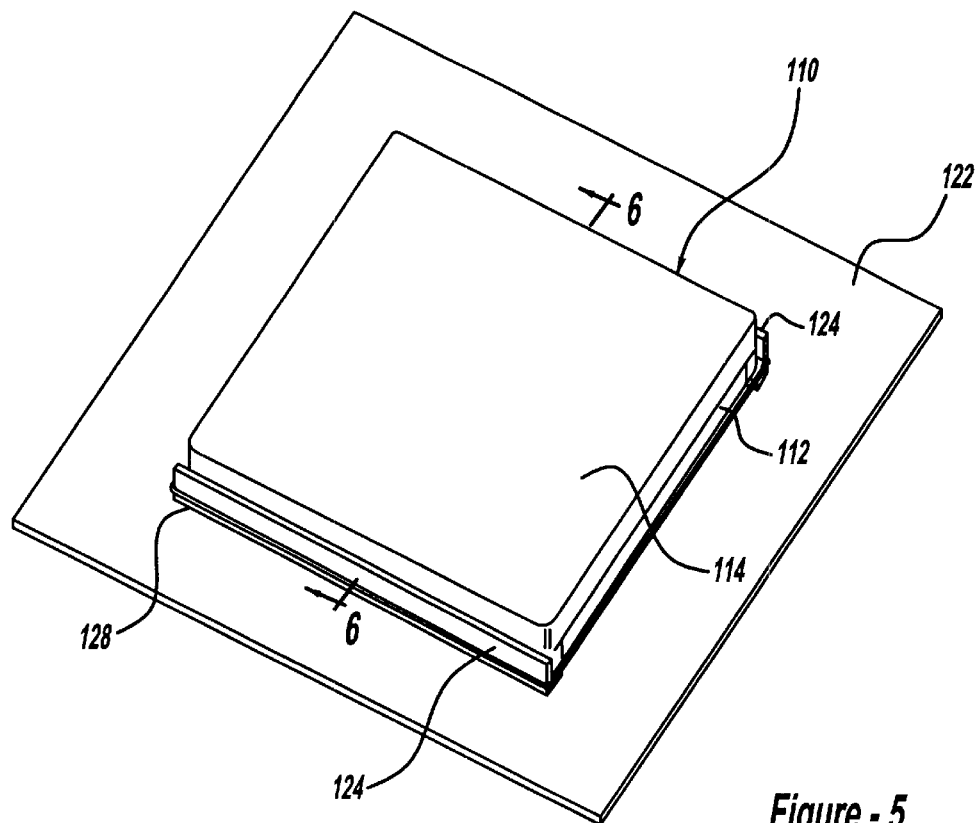
FIG. 5 is a perspective view of a column grid array integrated circuit package mounted on a circuit board and having an alternative preferred support assembly.
Figure 6:
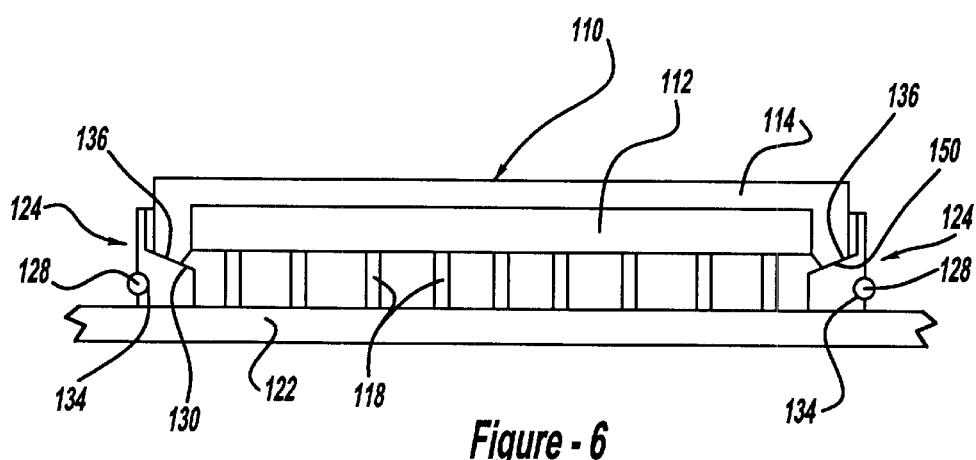
FIG. 6 is a cross-sectional view taken along line 6—6 of FIG. 5.

Referring to FIG. 5, an alternative preferred support assembly using only two opposing external support members 124 are provided. As used herein, "external" means a component which is not formed as a single, integral part with any portion of the integrated circuit package 110 (such as the substrate 112 or the package lid 114). Thus, a component is considered external if it is subsequently adhered to the integrated circuit package after its formation.

Each support member 124 has a biasing member guide 134 along its exterior surface. The ramped surface 130 extends laterally from the support member 124 toward the integrated circuit package 110. The package lid 114 of the integrated circuit package 110 extends around the edge of the substrate 112 and ends in a cooperating ramped surface 136. Thus, the support members 124 (including, e.g., the package lid 114) operate as support means for supporting the integrated circuit package 110. Similarly, the biasing member 128 operates at a biasing means for retaining the ramped surfaces 130, 136 to provide a supporting structure for the integrated circuit package 110.

Again, many possible variations may be made to this embodiment similar to those previously described. For example, each support member 124 could be broken into two corner sections as alternatively described above. In addition, the ramped surface 136 of the integrated circuit package 110 can alternatively be located on the substrate 112 rather than the package lid 114. Alternatively, the ramped surface 130 of the support member 124 merely works against the bottom edge of the flat substrate 112, rather than against a cooperating ramped surface 136.

Although it is believed that the related process is apparent from the above description, it will be briefly described hereinafter with respect to the support assembly of FIG. 1. An integrated circuit package 10 having an array of solder columns 18 extending to the circuit board 22 is mounted thereon. This may be accomplished, e.g., using known techniques, such as a convection reflow solder process.

With the integrated circuit package 10, such as the illustrated CGA integrated circuit package, mounted on the circuit board 22, the two opposing side members 24 are placed in position where they can support the integrated circuit package 10. In this case the protruding ledge 32 is located under the edges of the substrate 12. The two opposing end members 26 are placed so their ramped surfaces 36 cooperate with the corresponding ramped surfaces 30 of the two opposing end members. Thus, the support members 24, 26 are all in position where they can support the integrated circuit package 10.

Next, the biasing member 28 is placed around the support members 24, 26 and into the guide members 34, 38. The guide members 34, 38 hold and retain the biasing member 28 in place so that it does not come off of the support members 24, 26. As the biasing member 28 is released, a biasing force is exerted on the support members 24, 26 and the ramped surfaces 30, 36 cooperate to raise the combined height of the support members 24, 26 until the protruding ledge 32 is firmly in contact with the substrate 12 to support the integrated circuit package 10. The biasing member 28 continues to exert a biasing force which holds the support members 24, 26 in place and may also exert a slight upward force as discussed previously. If rework of any of the integrated circuit package 10 or its solder columns 18 is necessary, the support assembly may be easily and quickly removed using the reverse order of the process just described.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A support assembly useful for supporting an integrated circuit package having an array of solder columns extending to a circuit board when the integrated circuit package is mounted on the circuit board, the support assembly comprising:
   a. a support means for supporting the integrated circuit package, the support means having a ramped surface; and
   b. a biasing means associated with the support means for coupling the ramped surface to the integrated circuit package such that the support means resists downward movement of the integrated circuit package.

2. A support assembly according to claim 1, wherein the biasing means is selected from the group consisting of a coiled spring and an elastic band.

3. A support assembly according to claim 1, wherein the support means further comprises a plurality of support members, each having a ramped surface.

4. A support assembly according to claim 1, wherein each of said plurality of support members is a component which is external to the integrated circuit package.

5. A support assembly according to claim 1, wherein the ramped surface is at an angle having a tangent that is less than about the coefficient of friction of the ramped surface.

6. A support assembly according to claim 1, wherein the ramped surface is inclined at an angle from about 5 degrees to about 15 degrees.

7. A support assembly according to claim 1, wherein the biasing means exerts a force on the support means of less than about 1.5 pounds.

8. A support assembly useful for supporting an integrated circuit package having an array of solder columns extending to a circuit board when the integrated circuit package is mounted on the circuit board, the support assembly comprising:
   a. a support member supporting the integrated circuit package, the support member having a ramped surface;
   b. a cooperating support member having a cooperating ramped surface cooperating with the ramped surface of the support member; and
   c. a biasing member associated with the first and second support members to bias the first and second ramped surfaces together to adjust a height of the combined first and second support members to contact the integrated circuit package.

9. A support assembly according to claim 8, wherein at least one of the ramped surfaces is a component which is external to the integrated circuit package.

10. A support assembly according to claim 8, wherein the ramped surface is at an angle having a tangent that is less than about the coefficient of friction of the ramped surface.

11. A support assembly according to claim 8, wherein the biasing means in combination with the support means exerts an upward force on the integrated circuit package of less than about 12 pounds.

12. A support assembly according to claim 8, wherein the biasing member is selected from the group consisting of a coiled spring and an elastic band.

13. A support assembly according to claim 8, wherein the biasing member exerts a force on the support members of less than about 1.5 pounds.

14. A support assembly according to claim 8, wherein the ramped surface is inclined at an angle from about 5 degrees to about 15 degrees.

15. A method useful for supporting an integrated circuit package mounted on the circuit board by an array of solder columns extending between the integrated circuit package and the circuit board, the method comprising:
   a. locating a support member having a ramped surface in a position to support the integrated circuit package; and
   b. biasing the support member to retain the support member in the integrated circuit package and enabling the support member to resist a downward force on the integrated circuit package.

16. A method according to claim 15, wherein the step of locating a support member further comprises locating a plurality of support members each having a ramped surface and providing a plurality of cooperating support members, each having a cooperating ramped surface cooperating with one of the ramped surfaces or one of the support members.

17. A method according to claim 16, wherein the biasing step further comprises increasing the combined height of the plurality of support members and cooperating support members to contact the integrated circuit package.

18. A method according to claim 15, further comprising providing the ramped surface at an angle having a tangent that is less than about the coefficient of friction of the ramped surface.

19. A method according to claim 15, further comprising providing the ramped surface at an angle from about 5 degrees to about 15 degrees.

20. A method according to claim 15, wherein the biasing step further provides an upward force on the integrated circuit package of less than about 12 pounds.

* * * * *